(12) United States Patent
Sasaki et al.

(10) Patent No.: US 9,841,457 B1
(45) Date of Patent: Dec. 12, 2017

(54) PSEUDO FLEXURE FOR DISK DRIVE AND METHOD OF TESTING ELECTRONIC CIRCUIT FOR DISK DRIVE

(71) Applicants: NHK SPRING CO., LTD., Yokohama-shi, Kanagawa (JP); WESTERN DIGITAL TECHNOLOGIES, INC., Irvine, CA (US)

(72) Inventors: Futa Sasaki, Aiko-gun (JP); Hajime Arai, Aiko-gun (JP); Tomohisa Okada, Fujisawa (JP); Nobumasa Nishiyama, Fujisawa (JP); Kazuhiro Nagaoka, Fujisawa (JP)

(73) Assignees: NHK SPRING CO., LTD., Yokohama-Shi, Kanagawa (JP); WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/340,582

(22) Filed: Nov. 1, 2016

(51) Int. Cl.
*G01R 31/28* (2006.01)

(52) U.S. Cl.
CPC ..... *G01R 31/2803* (2013.01); *G01R 31/2829* (2013.01)

(58) Field of Classification Search
CPC ............. H04B 3/46; G11B 5/455; G01M 9/06
See application file for complete search history.

(56) References Cited

U.S. PATENT DOCUMENTS

| | | | |
|---|---|---|---|
| 4,532,802 A * | 8/1985 | Yeack-Scranton | G01B 7/34 324/212 |
| 6,111,406 A | 8/2000 | Garfunkel et al. | |
| 6,472,866 B2 | 10/2002 | Aslami | |
| 6,690,546 B2 | 2/2004 | Gouo | |
| 7,630,174 B2 | 12/2009 | Sheng et al. | |
| 8,233,240 B2 | 7/2012 | Contreras et al. | |
| 8,295,013 B1 | 10/2012 | Pan et al. | |
| 8,325,446 B1 | 12/2012 | Liu et al. | |
| 9,330,693 B1 | 5/2016 | Hahn et al. | |
| 2005/0143946 A1 | 6/2005 | Gururangan et al. | |
| 2007/0188927 A1 * | 8/2007 | Zhu | G11B 5/4833 360/245.3 |
| 2013/0176645 A1 * | 7/2013 | Arai | G11B 5/486 360/245.8 |

FOREIGN PATENT DOCUMENTS

| | | |
|---|---|---|
| JP | 2000223840 A | 8/2000 |
| WO | 2014162952 A1 | 10/2014 |

* cited by examiner

*Primary Examiner* — Giovanni Astacio-Oquendo
*Assistant Examiner* — Alvaro Fortich
(74) *Attorney, Agent, or Firm* — Holtz, Holtz & Volek PC

(57) ABSTRACT

A test coupon includes a pseudo element circuit which is constituted of a main circuit section and an adjusting section. The main circuit section includes a first pattern conductor and second pattern conductors. The first pattern conductor and the second pattern conductors overlap one another with a dielectric layer interposed therebetween. The first pattern conductor electrically conducts to the second pattern conductors. The main circuit section represents the R-component and the L-component of an equivalent circuit, and is a dominant circuit element which determines a signal waveform. The adjusting section includes linear conductors. A peak of a voltage waveform is suppressed by the R- and L-components of the adjusting section.

15 Claims, 14 Drawing Sheets

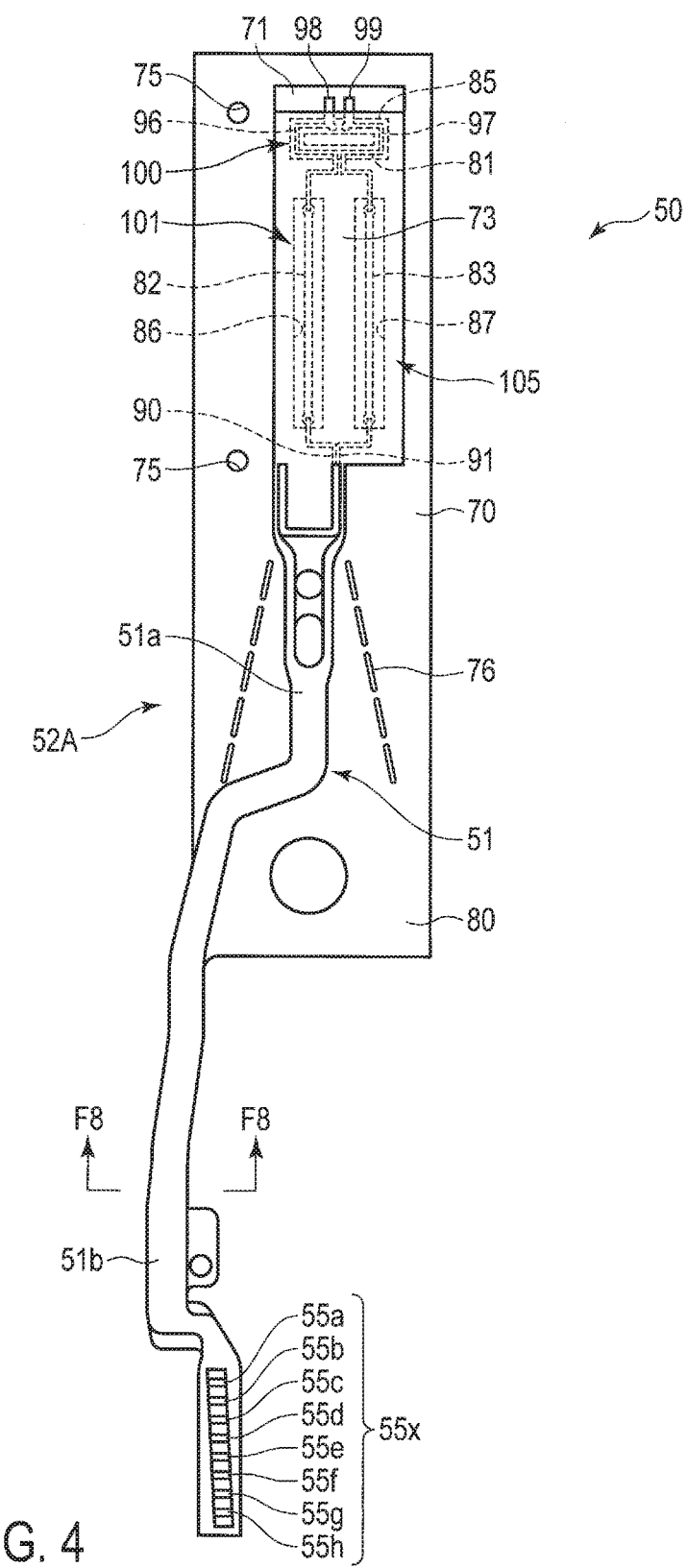
F I G. 4

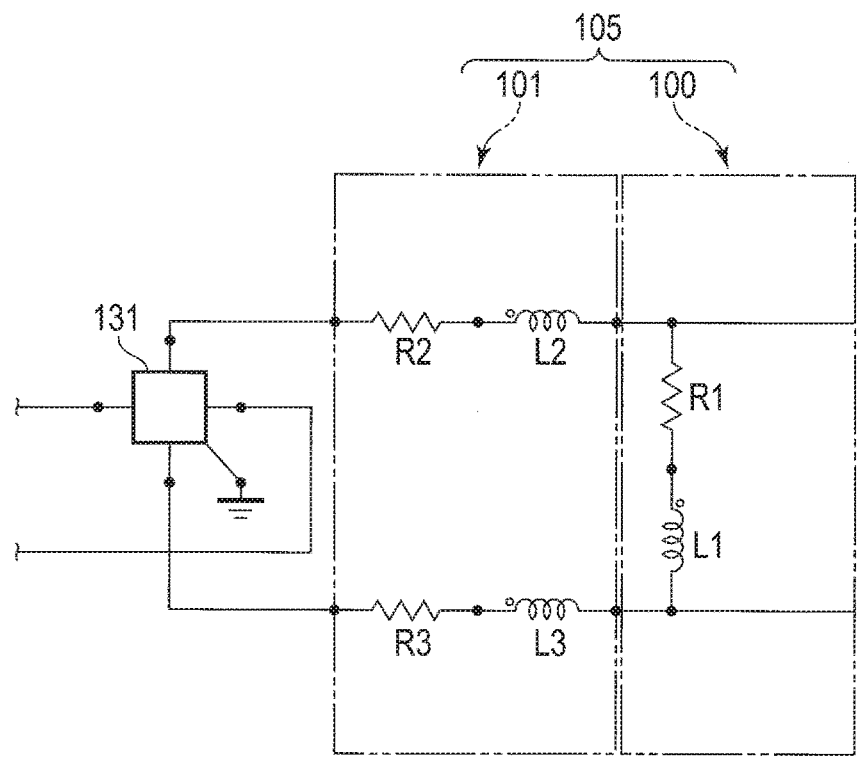
F I G. 11
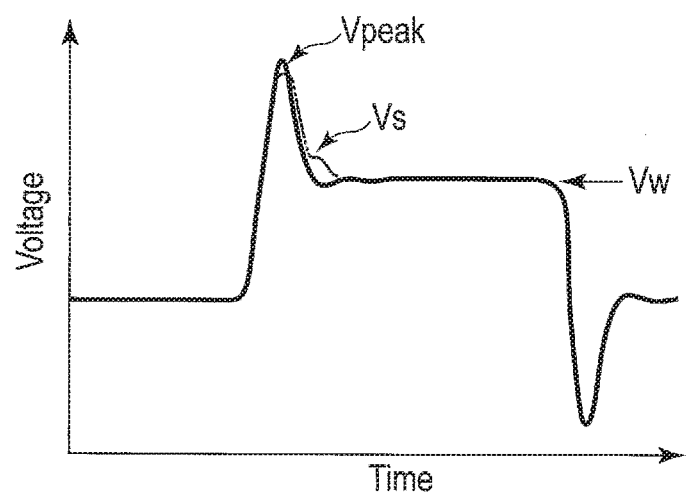
F I G. 12

Main section

| L-value | ↑ (Large) | ↓ (Small) | R-value | ↑ (Large) | ↓ (Small) |
|---|---|---|---|---|---|
| Vpeak | ↑ (High) | ↓ (Low) | Vpeak | ↑ (High) | ↓ (Low) |
| Vw | Not affected | | Vw | ↑ (High) | ↓ (Low) |

FIG. 13

Adjusting section

| L-value | ↑ (Large) | ↓ (Small) | R-value | ↑ (Large) | ↓ (Small) |
|---|---|---|---|---|---|
| Vpeak | ↓ (Low) | ↑ (High) | Vpeak | ↓ (Low) | ↑ (High) |
| Vw | Not affected | | Vw | ↓ (Low) | ↑ (High) |

FIG. 14

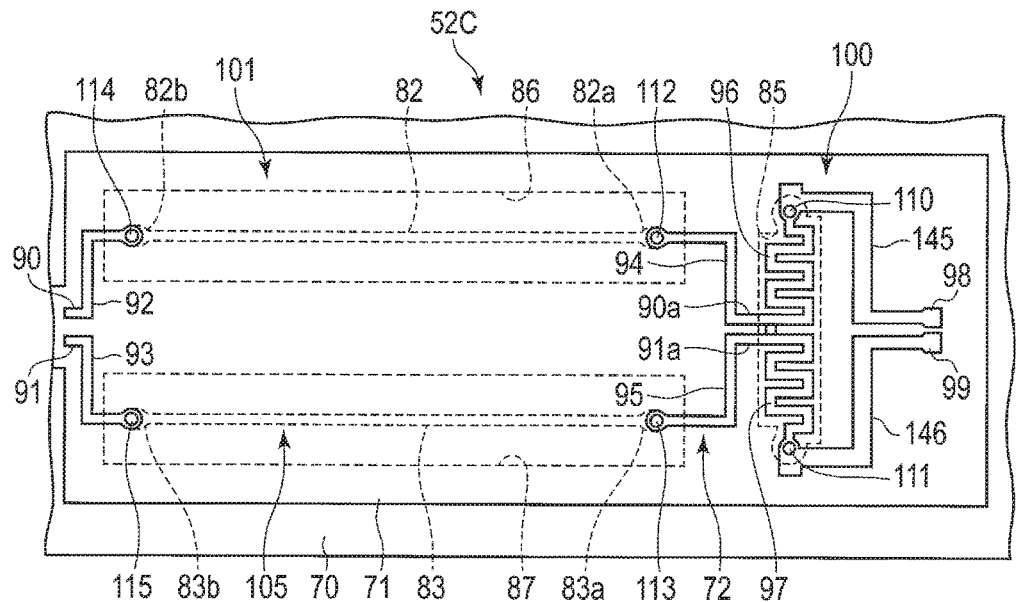
F I G. 17
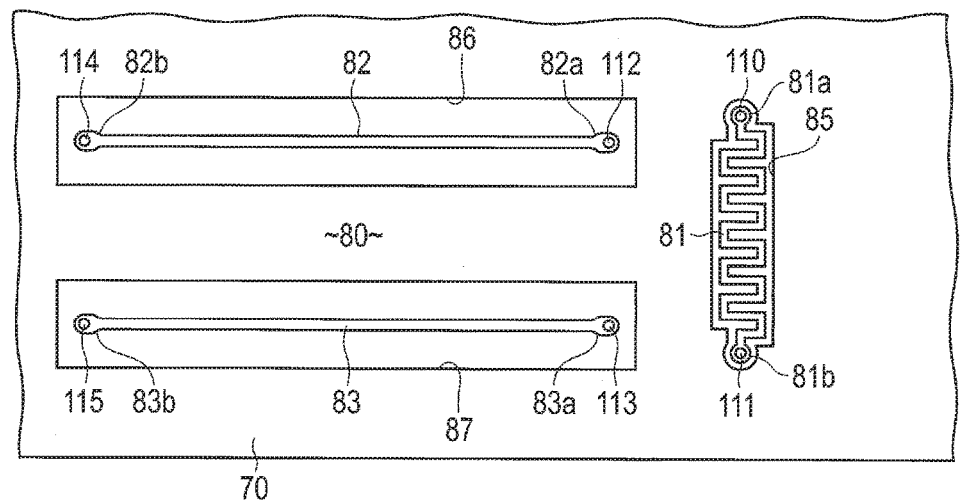
F I G. 18

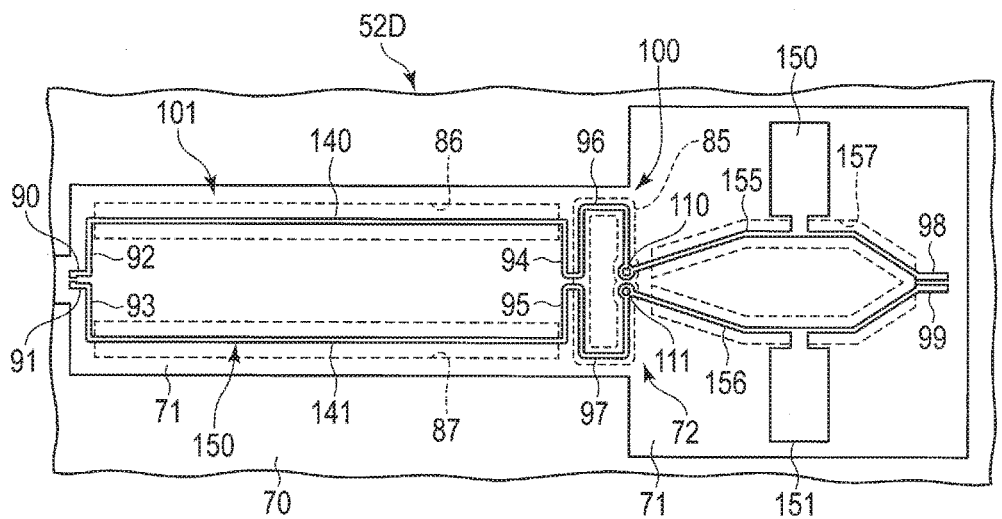
F I G. 19
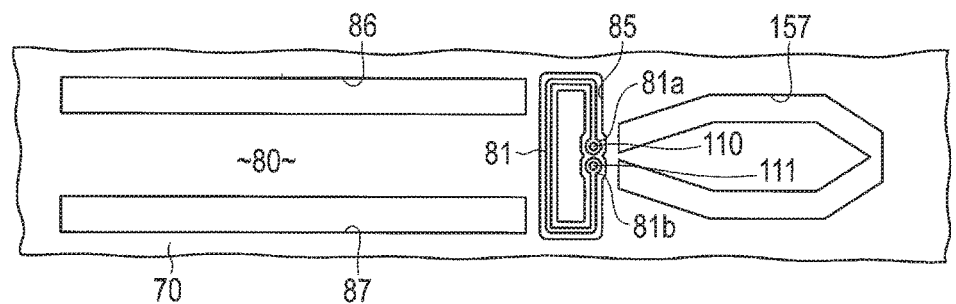
F I G. 20
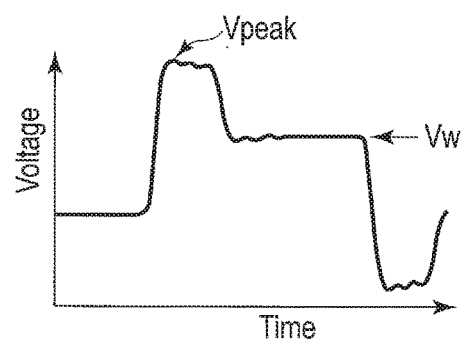
F I G. 21

PSEUDO FLEXURE FOR DISK DRIVE AND METHOD OF TESTING ELECTRONIC CIRCUIT FOR DISK DRIVE

BACKGROUND OF THE INVENTION

1. Field of the Invention

This invention relates to a pseudo flexure for a disk drive comprising a test coupon for use in a test and an evaluation, etc., of an electronic circuit of the disk drive, and a method of testing the electronic circuit for the disk drive.

2. Description of the Related Art

A hard disk drive (HDD) is used in an information processing apparatus, such as a personal computer. The hard disk drive comprises a magnetic disk rotatable about a spindle, a carriage turnable about a pivot, etc. On an arm of the carriage, a disk drive suspension (which will be hereinafter simply referred to as a suspension) is provided.

The suspension comprises elements such as a load beam, and a flexure disposed to overlap the load beam. A magnetic head including a slider is mounted on a gimbal portion formed near a distal end of the flexure. The magnetic head is provided with elements for accessing data, that is, for reading or writing data. The load beam and the flexure, etc., constitute a head gimbal assembly.

Various types of flexures have been put to practical use according to the required specification. For example, a flexure with conductors as disclosed in Patent Literature 1 (U.S. Pat. No. 8,325,446 B) or Patent Literature 2 (U.S. Pat. No. 8,295,013 B) is known. The flexure with conductors includes a metal base formed of a thin stainless steel plate, an insulating layer formed on the metal base, a plurality of conductors formed on the insulating layer, etc. The insulating layer is formed of an electrically insulating material such as polyimide. Part of the conductors is for writing. An end of a write conductor is connected to an element (for example, a magnetic coil) arranged in a magnetic head. The other end of the write conductor is connected to a signal output circuit of a preamplifier via a circuit board such as a flexible printed circuit (FPC).

In order to commercialize a disk drive including a suspension which has been newly developed and put it on the market, it is important to fully examine the electrical properties of the electronic circuit including the magnetic head. Therefore, in the past, a test was conducted by using a test apparatus in a state where a magnetic head (a slider including a write element) was mounted on a flexure, and the flexure was arranged on a load beam. For example, by bringing a probe of the test apparatus into contact with a pad which electrically conducts to the element of the magnetic head, electrical conduction between the element and the test apparatus is established. In this state, a pulse signal for testing is input to the electronic circuit. Further, based on a voltage waveform which is output from the pad, the characteristics of the electronic circuit including a conductive circuit portion of the flexure are inspected.

An attempt is being made to miniaturize the magnetic head (the slider) mounted on the suspension. Further, in accordance with an increase in the number of elements of the magnetic head, the number of pads has been increased. For this reason, an interval between adjacent pads (i.e., a pad pitch) tends to be small. For example, in a conventional magnetic head having four pads, the width of the magnetic head is about 1 mm, and the pad pitch is about 0.2 mm. In a magnetic head having eight pads which is available recently, the width of the magnetic head is reduced to about 0.7 mm, and the pad pitch is reduced to about 0.08 mm. Nowadays, a magnetic head having an even greater number of pads (for example, fourteen pads) has been developed. Therefore, it is getting more and more difficult to accurately contact the probe of the test apparatus (i.e., perform probing) on the pads arranged in a narrow range.

Since the magnetic head is small, in order to mount the magnetic head on the flexure, a dedicated mounting apparatus is used. When such a mounting apparatus is used, the flexure needs to be mounted on the load beam in advance. That is, in a state where the suspension is constituted by the flexure on which the magnetic head is mounted and the load beam, measurement is performed. For this reason, the magnetic head is swung easily at the time of measurement, and performing the probing stably is difficult. Also, when the probe is pressed strongly against the pad, a gimbal portion may be deformed, and the electrical properties may vary. Further, there is also a problem that in order to test the electronic circuit by using the magnetic head, the testing can only be performed when the magnetic head and the suspension are both completed.

A method which can be adopted alternatively is to evaluate the electrical properties by using a pseudo head probe device without mounting the magnetic head on the flexure. The pseudo head probe device comprises a chip resistor connected to a distal end of a commercially available probe, and probe pins provided on the chip resistor. The chip resistor has the electrical resistance close to that of the actual magnetic head. However, adjustment of the resistance (R-component) is difficult in such a pseudo head probe device, and obtaining a desired inductance value is also difficult. Also, variations of the electrical properties are relatively large in this type of handmade pseudo head probe device, and evaluating the test result is sometimes hard. Further, the pseudo head probe device has a problem, such as that the probe pins lack flexibility, so that probing is difficult.

For the purpose of testing a general electronic circuit, a pseudo circuit for testing as disclosed in Patent Literature 3 (WO 2014/162952) and a test coupon as disclosed in Patent Literature 4 (JP 2000-223840 A) are publicly known. However, in the present state of this industry, there is no product specialized in a pseudo flexure comprising a test coupon which can simulate a special electronic circuit including an element of a magnetic head mounted on a disk drive suspension, and thus development of such a pseudo flexure has been desired.

BRIEF SUMMARY OF THE INVENTION

Accordingly, an object of the present invention is to provide a pseudo flexure for a disk drive comprising a test coupon having electrical properties corresponding to those of an element of a magnetic head.

An embodiment relates to a pseudo flexure for a disk drive comprising a flexure body portion including a conductive circuit portion, and a test coupon which electrically conducts to the conductive circuit portion, in which the test coupon comprises: a substrate formed of a first metal such as stainless steel; a dielectric layer formed of an electrically insulating resin, and having a first surface and a second surface, in which the first surface overlaps the substrate; a metal layer formed of a second metal such as copper whose electrical resistance is different from that of the first metal, and arranged on the second surface of the dielectric layer; a pair of input-side terminal portions electrically connected to write conductors of the conductive circuit portion; a pair of pads for probing provided at a detection position; and a pseudo element circuit formed between the input-side terminal portions and the pads for probing. The pseudo element circuit comprises a main circuit section having a double-layered conductor structure, and an adjusting section having a single-layered conductor structure. The main circuit section includes a first pattern conductor formed of the first metal such as stainless steel, and a pair of second pattern conductors, which is formed of the second metal such as copper, overlaps the first pattern conductor with the dielectric layer interposed therebetween, and is connected to the first pattern conductor. In contrast, the adjusting section includes a pair of linear conductors arranged along the dielectric layer, and the linear conductors are electrically connected to the second pattern conductors, respectively. Although an example of the first metal is stainless steel, the first metal may be other than stainless steel. Further, although an example of the second metal is copper, the second metal may be other than copper.

This embodiment comprises the pseudo flexure comprising the test coupon having electrical properties corresponding to those of an element mounted on a magnetic head of a disk drive. Accordingly, even if an actual magnetic head is not mounted, by using a substantially flat pseudo flexure, a characteristic test and an evaluation, etc., of an electronic circuit of the disk drive can be carried out under a condition equivalent to that applied to a flexure comprising the magnetic head.

In one embodiment, the linear conductors are formed of the first metal, and the linear conductors are arranged on the first surface of the dielectric layer. In this embodiment, the substrate may comprise a first opening formed around the first pattern conductor, and second openings formed around the linear conductors. Further, the pseudo flexure may comprise connection conductors which penetrate the dielectric layer in a thickness direction, and the second pattern conductors and the linear conductors may be electrically connected to each other via the connection conductors.

In one embodiment, the substrate of the test coupon, the first pattern conductor, and the linear conductors are formed of stainless steel having chemical components common to each other. Further, the flexure body portion may comprise a metal base formed of the first metal, an insulating layer which is formed of an electrically insulating resin and formed on the metal base, the conductive circuit portion formed on the insulating layer, and a cover layer which is formed of an electrically insulating resin and covers the conductive circuit portion. A hole for positioning may be formed in the substrate of the test coupon.

Furthermore, the linear conductors may be formed of the second metal, and the linear conductors may be arranged on the second surface of the dielectric layer. The substrate may comprise openings formed along the linear conductors.

In one embodiment, between the input-side terminal portions and the pads for probing, the main circuit section is arranged close to the pads for probing, and the adjusting section is arranged close to the input-side terminal portions. The pseudo flexure may comprise a filter circuit between the main circuit section and each of the pads for probing. In another embodiment, between the input-side terminal portions and the pads for probing, the main circuit section is arranged close to the input-side terminal portions, and the adjusting section is arranged close to the pads for probing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a plan view showing an example of a pseudo flexure according to a first embodiment.

FIG. 11 is a diagram showing an equivalent circuit of the test coupon shown in FIG. 5.

FIG. 12 is a graph showing a voltage waveform of a write signal of the equivalent circuit shown in FIG. 11.

FIG. 13 is a table showing how an L-value and an R-value of a main circuit section of the equivalent circuit shown in FIG. 11 affect a voltage waveform.

FIG. 14 is a table showing how an L-value and an R-value of an adjusting section of the equivalent circuit shown in FIG. 11 affect a voltage waveform.

FIG. 17 is a plan view showing a test coupon of a pseudo flexure according to a third embodiment.

FIG. 18 is a plan view of a substrate of the test coupon shown in FIG. 17.

FIG. 19 is a plan view showing a test coupon of a pseudo flexure according to a fourth embodiment.

FIG. 20 is a plan view of a substrate of the test coupon shown in FIG. 19.

FIG. 21 is a graph showing a voltage waveform of a write signal of the test coupon shown in FIG. 19.

DETAILED DESCRIPTION OF THE INVENTION

Figure 1:
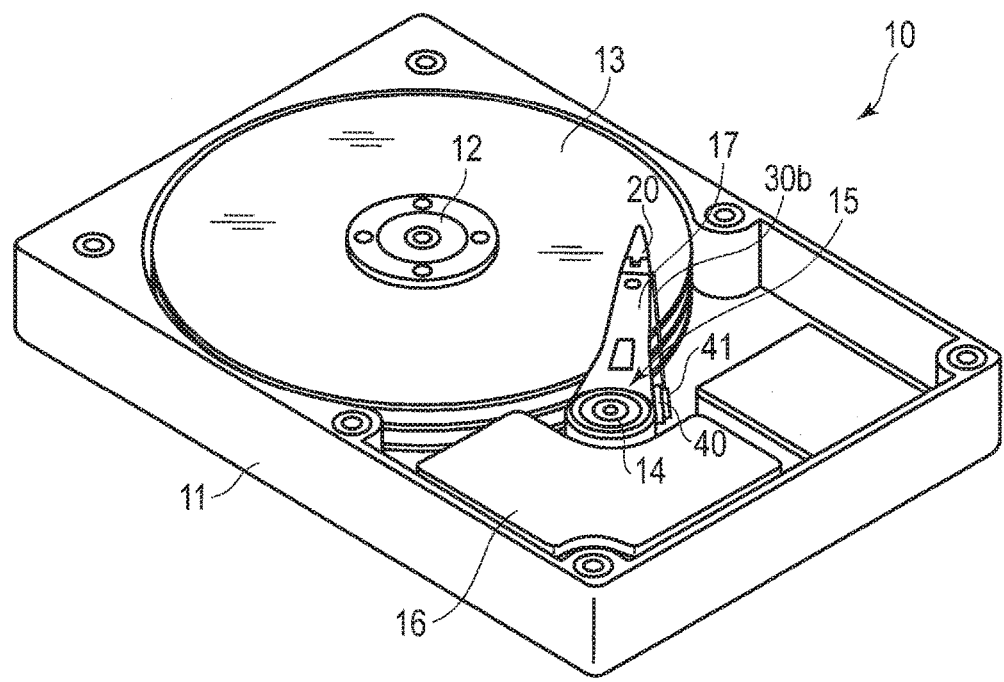
FIG. 1 is a perspective view showing an example of a disk drive.

A hard disk drive (HDD) 10 shown in FIG. 1 comprises a case 11, disks 13 rotatable about a spindle 12, a carriage 15 turnable about a pivot 14, and a positioning motor 16 for turning the carriage 15. The case 11 is sealed by a lid (not shown).

Figure 2:
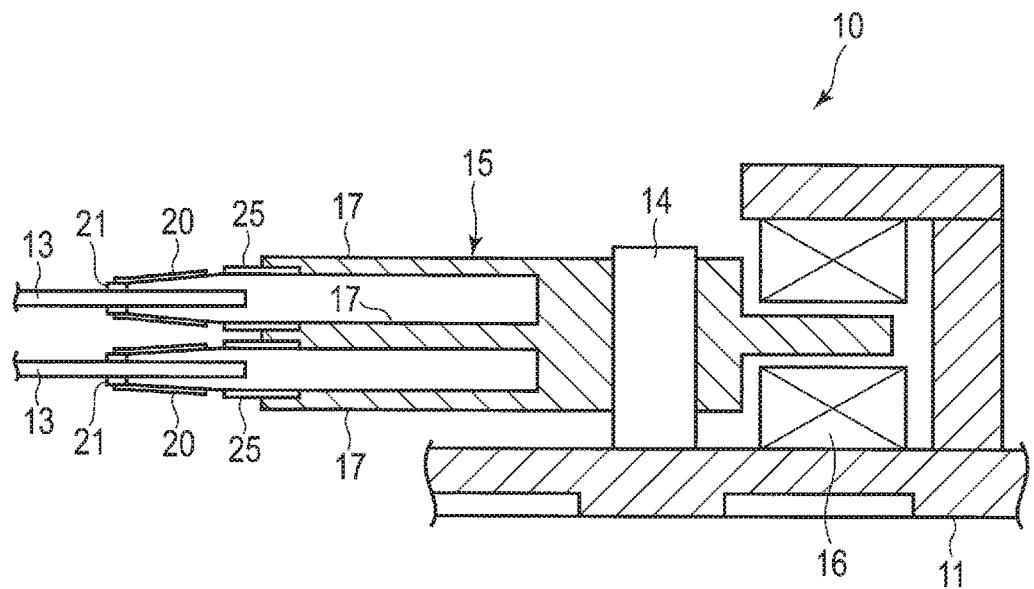
FIG. 2 is a cross-sectional view of a part of the disk drive shown in FIG. 1.

FIG. 2 is a cross-sectional view schematically showing a part of the disk drive 10. The carriage 15 is provided with arms 17. At a distal end portion of each arm 17, a disk drive suspension (hereinafter simply referred to as a suspension) 20 is mounted. A slider 21 is provided as a magnetic head at a distal end of the suspension 20. As each disk 13 rotates at high speed, an air bearing is formed between the disk 13 and the slider 21.

If the carriage 15 is turned by the positioning motor 16, the suspension 20 moves radially relative to the disk 13, and the slider 21 thereby moves to a desired track of the disk 13. The slider 21 is provided with a write element (for example, a magnetic coil) for recording data on the disk 13, a read element for reading data recorded on the disk 13, and the like. An example of the read element is a magnetoresistive (MR) element. The MR element converts a magnetic signal recorded on the disk 13 into an electrical resistance change.

Figure 3:
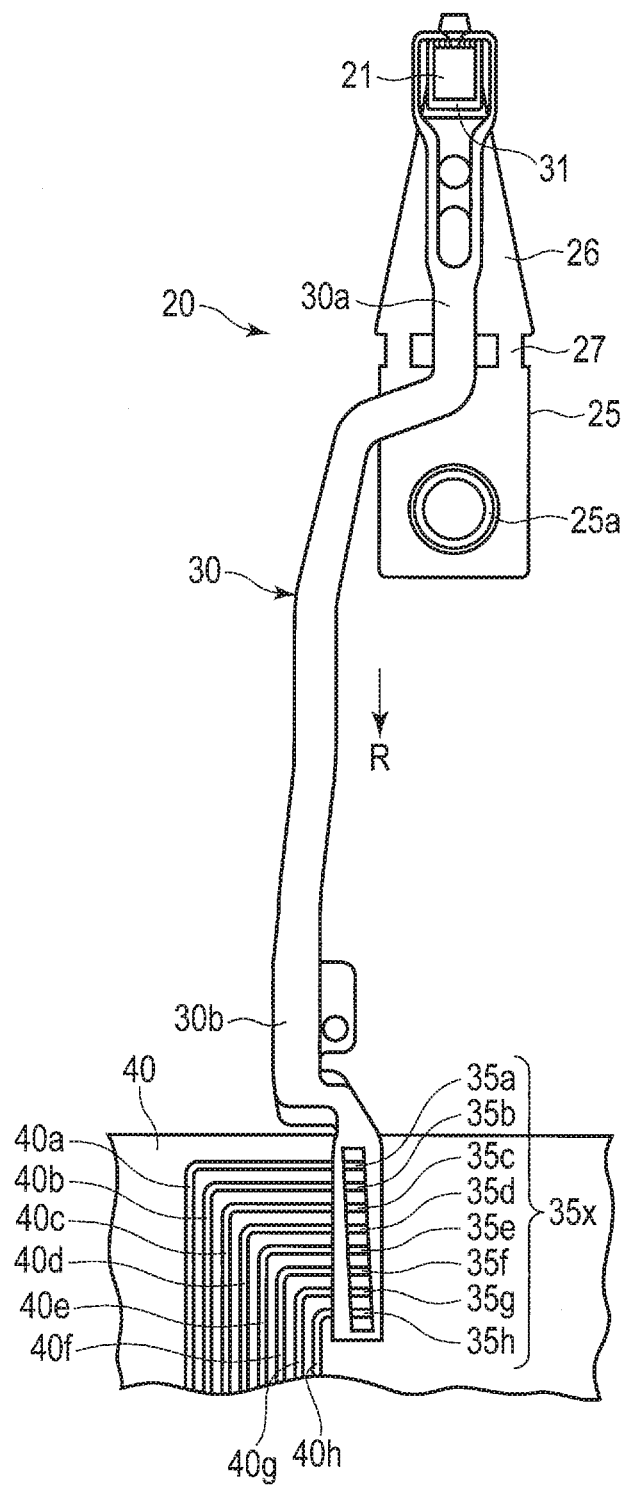
FIG. 3 is a plan view showing an example of a disk drive suspension and a part of a circuit board.

FIG. 3 shows an example of the suspension 20. The suspension 20 comprises a baseplate 25, a load beam 26, a hinge portion 27, and a flexure 30 with conductors. In the present specification, the flexure 30 with conductors may be simply referred to as the flexure 30. A boss portion 25a of the baseplate 25 is secured to the arm 17 (FIGS. 1 and 2) of the carriage 15. A tongue 31 is formed near a distal end of the flexure 30. The slider 21 is mounted on the tongue 31.

As shown in FIG. 3, the flexure 30 includes a proximal portion 30a secured to the load beam 26, and a tail portion 30b extending toward the back (i.e., in the direction indicated by arrow R in FIG. 3) of the baseplate 25 from the proximal portion 30a. A tail terminal group 35x is arranged in the tail portion 30b. An example of the tail terminal group 35x includes a ground tail terminal 35a, sensor tail terminals 35b and 35c, read tail terminals 35d and 35e, a heater tail terminal 35f, and write tail terminals 35g and 35h. The tail terminals 35a to 35h are connected to conductors 40a to 40h of a circuit board 40, respectively. An example of the circuit board 40 is a flexible printed circuit board (FPC).

On the circuit board 40, a preamplifier 41 (FIG. 1) which constitutes a part of a signal processing circuit is mounted. A read circuit of the preamplifier 41 is connected to the tail terminals 35d and 35e via read conductors 40d and 40e. A write circuit of the preamplifier 41 is connected to the tail terminals 35g and 35h via write conductors 40g and 40h.

A write current which is output from the preamplifier 41 is supplied to the write element (the magnetic coil) of the slider 21 via the write tail terminals 35g and 35h. An electrical resistance change detected by the read element (the MR element) of the slider 21 is input to the preamplifier 41 via the read tail terminals 35d and 35e and the conductors 40d and 40e of the circuit board 40.

Referring to FIGS. 4 to 14, a pseudo flexure 50 comprising a test coupon according to a first embodiment will be described.

FIG. 4 shows the pseudo flexure 50 for use in a test and an evaluation, etc., of an electronic circuit of a disk drive. The pseudo flexure 50 comprises a flexure body portion 51 and a test coupon 52A.

The flexure body portion 51 includes a proximal portion 51a and a tail portion 51b having structures substantially common to the flexure 30 of the suspension 20 shown in FIG. 3. For example, as shown in FIG. 4, a tail terminal group 55x is formed in the tail portion 51b. An example of the tail terminal group 55x includes a ground tail terminal 55a, sensor tail terminals 55b and 55c, read tail terminals 55d and 55e, a heater tail terminal 55f, and write tail terminals 55g and 55h.

Figure 8:
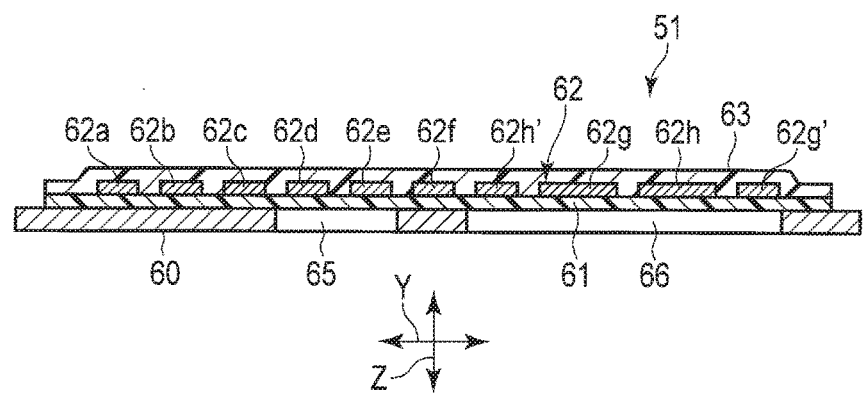
FIG. 8 is a cross-sectional view of a flexure body portion taken along line F8-F8 of FIG. 4.

FIG. 8 is a cross-sectional view of the flexure body portion 51 taken along line F8-F8 of FIG. 4. In FIG. 8, arrow Y indicates a width direction of the flexure body portion 51, and arrow Z indicates a thickness direction of the same. The flexure body portion 51 includes a metal base 60, an insulating layer 61 formed on the metal base 60, a conductive circuit portion 62 formed on the insulating layer 61, and a cover layer 63 covering the conductive circuit portion 62. The metal base 60 is formed of a plate of austenitic stainless steel, for example. Each of the insulating layer 61 and the cover layer 63 is formed of an electrically insulating resin such as polyimide.

An example of the conductive circuit portion 62 shown in FIG. 8 includes a ground conductor 62a, sensor conductors 62b and 62c, read conductors 62d and 62e, a heater conductors 62f, write conductors 62g and 62h, and branch conductors 62g' and 62h' which constitute an interleaved circuit. The metal base 60 is, for example, 20 μm (12 to 25 μm) in thickness. Openings 65 and 66 are formed in the metal base 60.

Figure 5:
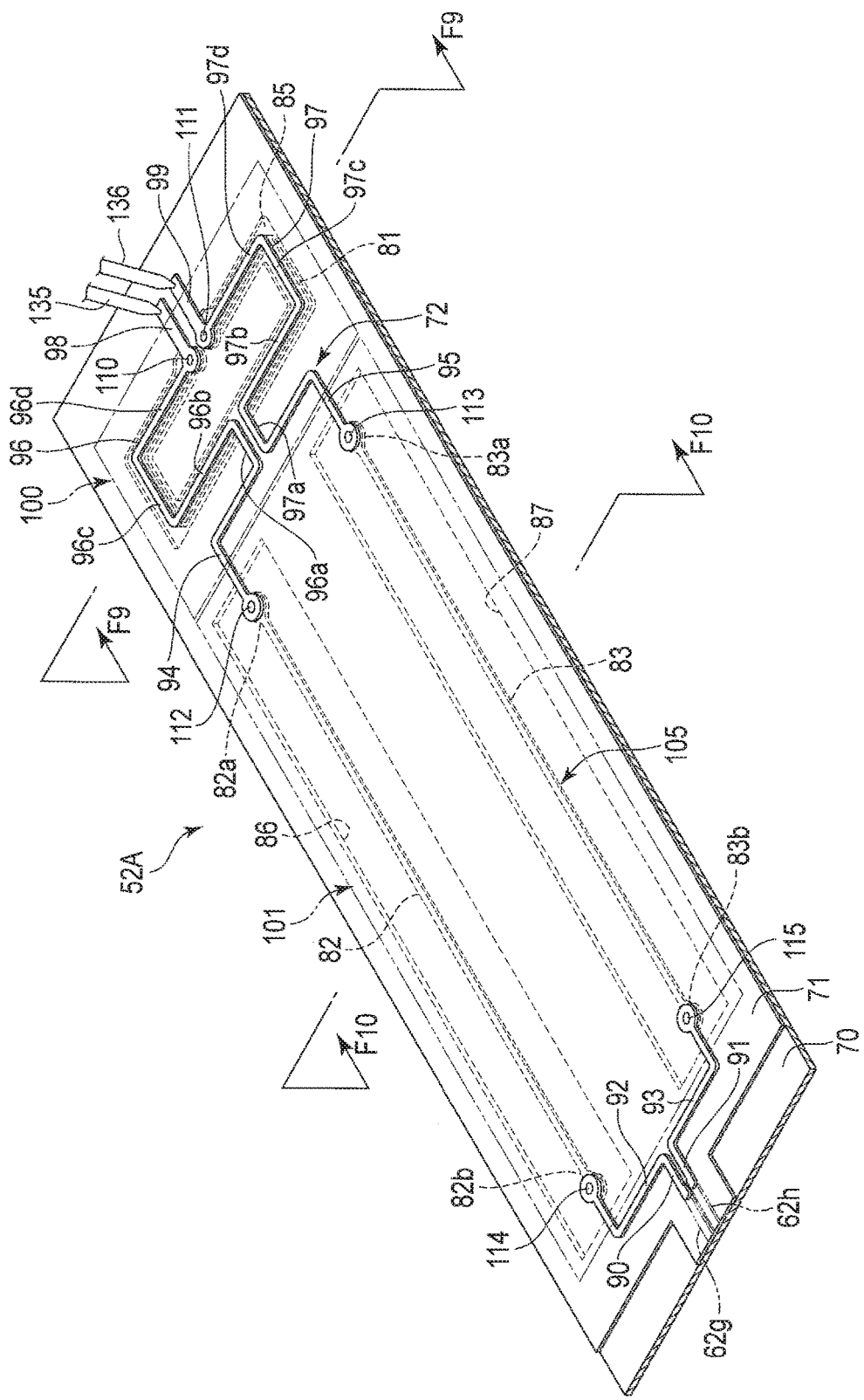
FIG. 5 is a perspective view of a test coupon of the pseudo flexure shown in FIG. 4.
Figure 6:
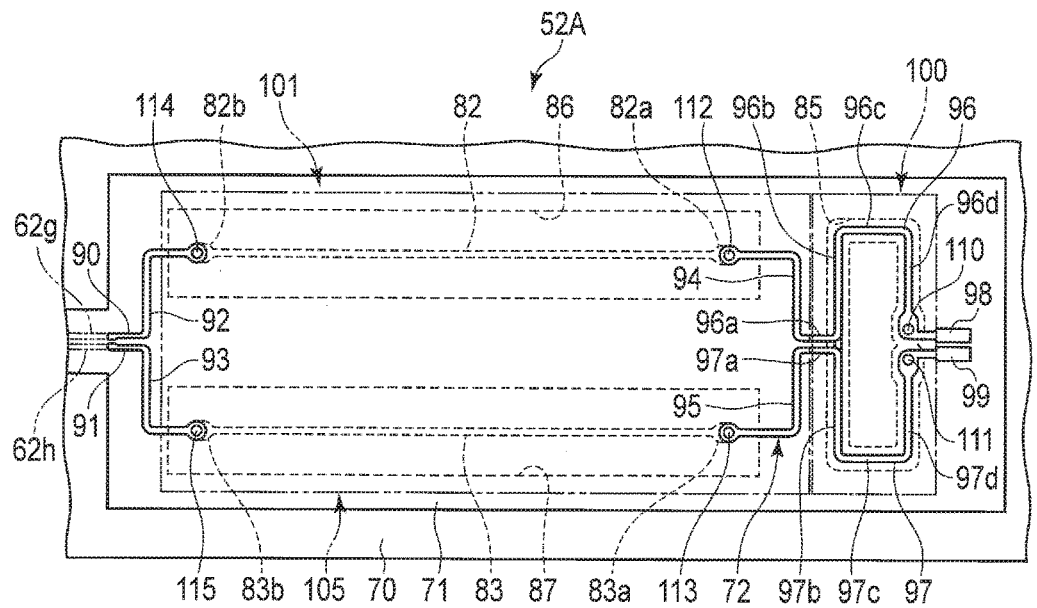
FIG. 6 is a plan view of the test coupon shown in FIG. 5.

FIG. 5 is a perspective view of the test coupon 52A according to the first embodiment. FIG. 6 is a plan view of the test coupon 52A. The test coupon 52A includes a substrate 70 shown in FIG. 7, etc., a dielectric layer 71 formed on the substrate 70, a metal layer 72 formed on the dielectric layer 71, and a cover layer 73 (schematically shown by a two-dot chain line in FIGS. 9 and 10) covering the metal layer 72. The substrate 70 is formed of a first metal (for example, stainless steel). The metal layer 72 is formed of a second metal (for example, copper) whose electrical resistance is different from that of the first metal. Note that in FIGS. 5 and 6, in order to make the structure of the test coupon 52A easier to understand, the cover layer 73 is omitted. Also in FIGS. 15, 17, 19, 23, and 25 which will be described later, the cover layer 73 is omitted from illustration.

Figure 9:
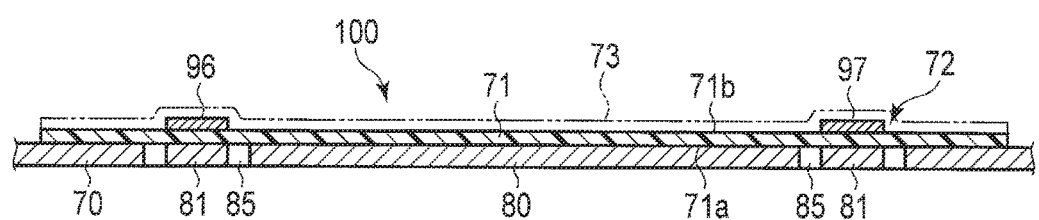
FIG. 9 is a cross-sectional view of the test coupon taken along line F9-F9 of FIG. 5.

At a part of the substrate 70, a hole 75 (FIG. 4) through which a positioning pin can be inserted as necessary is formed. Also, a display portion 76 is formed on the substrate 70. The display portion 76 is formed of a plurality of long holes forming lines which conform to a contour of the load beam 26 (FIG. 3). As shown in FIG. 9, the substrate 70 overlaps one side (a first surface) 71a of the dielectric layer 71.

The substrate 70 is formed of the first metal (for example, austenitic stainless steel such as SUS304) as that of the metal base 60 of the flexure body portion 51. The chemical components (wt %) of SUS304 are C:0.08 or less, Si:1.00 or less, Mn:2.00 or less, Ni:8.00 to 10.50, Cr:18.00 to 20.00, and Fe: the remainder. The metal base 60 and the substrate 70 are contiguous with each other on the same plane. The thickness of the substrate 70 is the same as that of the metal base 60, and is, for example 20 μm (12 to 25 μm).

Figure 7:
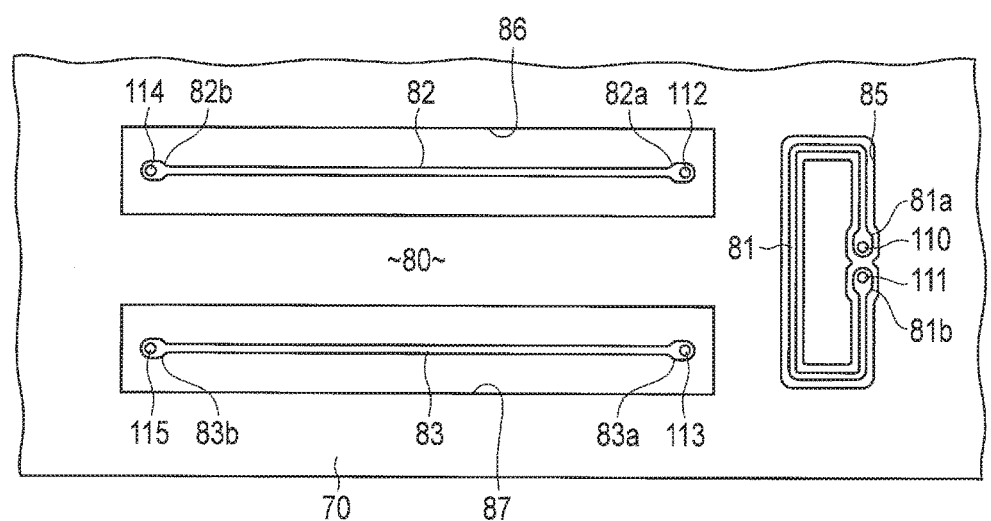
FIG. 7 is a plan view of a substrate of the test coupon shown in FIG. 5.

As shown in FIG. 7, etc., the substrate 70 includes a flat substrate body portion 80, a first pattern conductor 81, and a pair of linear conductors 82 and 83. The substrate body portion 80 occupies most of the area of the substrate 70. The first pattern conductor 81 is a part of the substrate 70, and its contour is formed by a forming means such as etching. The first pattern conductor 81 and the linear conductors 82 and 83 are formed of the first metal such as stainless steel. The linear conductors 82 and 83 are part of the substrate 70 likewise the first pattern conductor 81.

Each of the first pattern conductor 81 and the linear conductors 82 and 83 is arranged along the first surface 71a of the dielectric layer 71. A first opening 85 is formed around the first pattern conductor 81. The first pattern conductor 81 is formed in a substantially rectangular shape in a planar view (FIG. 7) of the substrate 70. The first pattern conductor 81 is electrically independent from the substrate body portion 80.

The pair of linear conductors 82 and 83 extends parallel to each other along the first surface 71a of the dielectric layer 71 in a planar view of the substrate 70, and form elongated linear shapes, respectively. Second openings 86 and 87 are formed around the linear conductors 82 and 83, respectively. Each of the linear conductors 82 and 83 is electrically independent from the substrate body portion 80.

Figure 10:
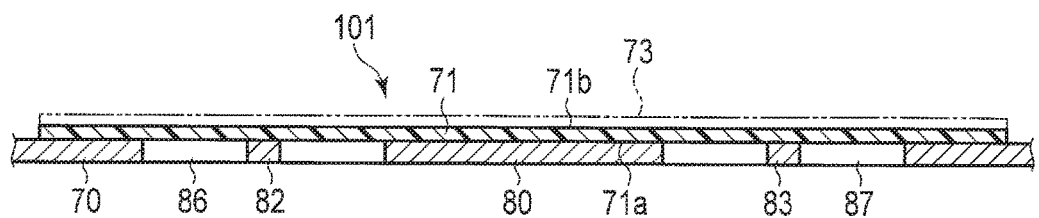
FIG. 10 is a cross-sectional view of the test coupon taken along line F10-F10 of FIG. 5.

The dielectric layer 71 is formed of an electrically insulating resin (a dielectric material) such as polyimide, which is the same material as the insulating layer 61 (FIG. 8) of the flexure body portion 51. The thickness of the dielectric layer 71 is, for example, 10 μm (5 to 20 μm), and the dielectric layer 71 is formed on the substrate 70 such that the thickness is even. As shown in FIGS. 9 and 10, the first surface 71a of the dielectric layer 71 overlaps the substrate 70. The cover layer 73 is formed of polyimide likewise the cover layer 63 of the flexure body portion 51. The thickness of the cover layer 73 is, for example, 4 μm (2 to 10 μm). The dielectric layer 71 and the cover layer 73 play a role in a capacitor component (C-component) of the test coupon 52A.

As shown in FIG. 9, the metal layer 72 is formed on the other side (a second surface) 71b of the dielectric layer 71. The metal layer 72 is formed of the second metal (for example, plating copper), which is the same material as the conductive circuit portion 62 of the flexure body portion 51. The thickness of the metal layer 72 is, for example, 5 μm (4 to 15 μm).

As shown in FIGS. 5 and 6, the metal layer 72 includes a pair of input-side terminal portions 90 and 91, input-side electrical paths 92 and 93, intermediate electrical paths 94 and 95, second pattern conductors 96 and 97, and pads 98 and 99 for probing. The pads 98 and 99 for probing are arranged at a waveform detection position. The input-side terminal portions 90 and 91 electrically conduct to the write conductors 62g and 62h of the flexure body portion 51.

The second pattern conductors 96 and 97 comprise neck portions 96a and 97a which are continuous with the intermediate electrical paths 94 and 95, first portions 96b and 97b which are continuous with the neck portions 96a and 97a, second portions 96c and 97c which are parallel to each other, and third portions 96d and 97d which are continuous with the second portion 96c and 97c, respectively. The third portions 96d and 97d electrically conduct to the pads 98 and 99 for probing.

The test coupon 52A of the present embodiment comprises a main circuit section 100 (a first circuit section surrounded by a one-dot chain line in FIGS. 5 and 6), and an adjusting section 101 (a second circuit section surrounded by a two-dot chain line in FIGS. 5 and 6). The main circuit section 100 and the adjusting section 101 constitute a pseudo element circuit 105 having electrical properties corresponding to those of a write coil of the magnetic head. The main circuit section 100 and the adjusting section 101 are formed to be connected in series between the input-side terminal portions 90 and 91 and the pads 98 and 99 for probing.

In the present embodiment, the main circuit section 100 is arranged close to the pads 98 and 99 for probing between the input-side terminal portions 90 and 91 and the pads 98 and 99 for probing. The adjusting section 101 is arranged close to the input-side terminal portions 90 and 91. FIG. 9 is a cross-sectional view of the main circuit section 100 taken along line F9-F9 of FIG. 5. FIG. 10 is a cross-sectional view of the adjusting section 101 taken along line F10-F10 of FIG. 5.

The main circuit section 100 comprises the first pattern conductor 81 and the pair of second pattern conductors 96 and 97. The first pattern conductor 81 is provided on the side 71a, which is one of the two sides of the dielectric layer 71. The second pattern conductors 96 and 97 are provided on the other side 71b of the dielectric layer 71. The second pattern conductors 96 and 97 overlap the first pattern conductor 81 with the dielectric layer 71 interposed therebetween. That is, the main circuit section 100 has a double-layered conductor structure including the first pattern conductor 81 and the second pattern conductors 96 and 97. As shown in FIG. 7, the first pattern conductor 81 has a shape (a substantially rectangular shape) corresponding to the first portions 96b and 97b, the second portions 96c and 97c, and the third portions 96d and 97d of the second pattern conductors 96 and 97.

The second pattern conductors 96 and 97 and the pads 98 and 99 for probing are connected to both ends 81a and 81b of the first pattern conductor 81 via connection conductors 110 and 111 such as through-hole vias, etc., respectively. The connection conductors 110 and 111 penetrate the dielectric layer 71 in the thickness direction. The second pattern conductors 96 and 97 may be connected to the first pattern conductor 81 at a part other than the both ends 81a and 81b of the first pattern conductor 81.

The neck portions 96a and 97a of the second pattern conductors 96 and 97 are connected to ends 82a and 83a of the linear conductors 82 and 83 via the intermediate electrical paths 94 and 95 and connection conductors 112 and 113 such as through-hole vias, respectively. The other ends 82b and 83b of the linear conductors 82 and 83 are connected to the input-side electrical paths 92 and 93 via connection conductors 114 and 115 such as through-hole vias, respectively. The input-side electrical paths 92 and 93 electrically conduct to the write conductors 62g and 62h of the flexure body portion 51 via the input-side terminal portions 90 and 91, respectively. The connection conductors 114 and 115 penetrate the dielectric layer 71 in the thickness direction.

The adjusting section 101 comprises the pair of linear conductors 82 and 83, and has a single-layered conductor structure. The linear conductors 82 and 83 are provided on the side 71a, which is one of the two sides of the dielectric layer 71. The end 82a of the linear conductor 82 electrically conducts to the second pattern conductor 96 via the connection conductor 112. The other end 82b of the linear conductor 82 electrically conducts to the write conductor 62g via the connection conductor 114 and the input-side terminal portion 90. The end 83a of the linear conductor 83 electrically conducts to the second pattern conductor 97 via the connection conductor 113. The other end 83b of the linear conductor 83 electrically conducts to the write conductor 62h via the connection conductor 115 and the input-side terminal portion 91.

FIG. 11 shows an equivalent circuit of the pseudo element circuit 105 which is constituted by the main circuit section 100 and the adjusting section 101. R1 and L1 in FIG. 11 represent the resistance component and the inductance component of the main circuit section 100, respectively. R2 and L2 represent one of the resistance components and inductance components of a parallel circuit which constitutes the adjusting section 101. R3 and L3 represent the other resistance component and inductance component of the circuit. A write signal is supplied to the pseudo element circuit 105 from an input-side circuit 131.

The first pattern conductor 81 and the linear conductors 82 and 83 are both part of the substrate 70. That is, the first pattern conductor 81 and the linear conductors 82 and 83 are formed of the first metal (for example stainless steel), which is the same material as the substrate 70. In contrast, the second pattern conductors 96 and 97 are formed of the second material whose electrical resistance is smaller than that of the first metal. An example of the second metal is copper. The electrical resistance of stainless steel is 50 $\Omega$m ($10^{-8}$) or more, which is several tens of times greater than the electrical resistance of copper (1.68 $\Omega$m [$10^{-8}$]). For example, the electrical resistance of SUS304 is 72 $\Omega$m ($10^{-8}$), and is 40 times greater than the electrical resistance of copper. In the main circuit section 100 and the adjusting section 101 of the present embodiment, since the electrical properties of the conductors 81, 82 and 83 formed of stainless steel whose electrical resistance is far greater than that of copper is used, a resistance value which is appropriate as the resistance of an equivalent circuit of the write coil of the magnetic head can be realized.

In the test coupon 52A of the present embodiment, the main circuit section 100 serves as a serial element constituted of the R-component (resistance component) and the L-component (inductance component). The main circuit section 100 has the double-layered conductor structure including the first pattern conductor 81 and the second pattern conductors 96 and 97. The main circuit section 100 is a dominant circuit element which determines a signal waveform (in particular, a value of Vw), and is largely affected by the R-component. In contrast, the adjusting section 101 has a single-layered conductor structure having only the linear conductors 82 and 83. The R-components and L-components of the adjusting section 101 have the function of suppressing the peak (Vpeak) of the waveform which has been made high by the L-component of the main circuit section 100. The adjusting section 101 is largely affected by the L-components.

FIG. 12 shows an example of a waveform of a signal supplied to the write coil. Each of Vpeak and Vw is changed in accordance with the values of the R-components and the L-components of the main circuit section 100 and the adjusting section 101. By using this characteristic, the pseudo element circuit 105 which conforms to a target waveform is found by analysis. For example, in the main circuit section 100, by adjusting the R-component which is achieved by means such as adjusting the length or cross-sectional area of each conductor, Vw is controlled to conform to the target waveform. The key to achieving the above is to reduce the L-component of the main circuit section 100 as much as possible, and to moderate the under-shoot Vs of the waveform while approximating Vpeak to an actual value in the write coil. In contrast, in the adjusting section 101, by adjusting the length or cross-sectional area of the linear conductor, for example, thereby adjusting the R-components and the L-components, fine adjustment is performed so that Vpeak and Vw of the waveform conform to the target waveform. Here, it is important to take a balance of Vpeak and Vw.

FIG. 13 indicates how an L-value and an R-value of the main circuit section 100 affect a voltage waveform. In the main circuit section 100, the greater the L-value is, the higher Vpeak is, Vw not being affected. In contrast, the smaller the L-value is, the lower Vpeak is, Vw not being affected. The greater the R-value of the main circuit section 100 is, the higher Vpeak is, as is Vw. In contrast, the smaller the R-value is, the lower Vpeak is, as is Vw.

FIG. 14 indicates how an L-value and an R-value of the adjusting section 101 affect a voltage waveform. In the adjusting section 101, the greater the L-value is, the lower Vpeak is, Vw not being affected. In contrast, the smaller the L-value is, the higher Vpeak is, Vw not being affected. The greater the R-value of the adjusting section 101 is, the lower Vpeak is, as is Vw. In contrast, the smaller the R-value is, the higher Vpeak is, as is Vw.

When a test, etc., of an electronic circuit is to be performed by using the pseudo flexure 50 of the present embodiment, the substrate 70 of the pseudo flexure 50 is fixed to a support portion of a test apparatus, etc. Further, the pads 98 and 99 for probing of the pseudo flexure 50 are brought into contact with probes 135 and 136 for detection (FIG. 5). A pulse signal for testing is input to the pseudo element circuit 105 of the test coupon 52A though the write conductors 62g and 62h of the flexure body portion 51. Further, the voltage waveform output from the pads 98 and 99 for probing is observed by using a device such as an oscilloscope.

The pseudo flexure 50 of the present embodiment is formed to be substantially flat. Moreover, the pseudo flexure 50 can be tested without mounting it on the load beam 26 (FIG. 3). In addition, by inserting a positioning pin into the hole 75 (FIG. 4) of the substrate 70, moving of the pseudo flexure 50 can be stopped. Consequently, the probes 135 and 136 can be made to contact the pads 98 and 99 for probing stably. Further, before an actual magnetic head (a slider) is completed, it is possible to sufficiently review an evaluation of the electronic circuit by using the pseudo element circuit 105 having electrical properties corresponding to those of the write coil. Note that the pseudo flexure 50 can be tested while the pseudo flexure 50 is mounted on the load beam.

Figure 15:
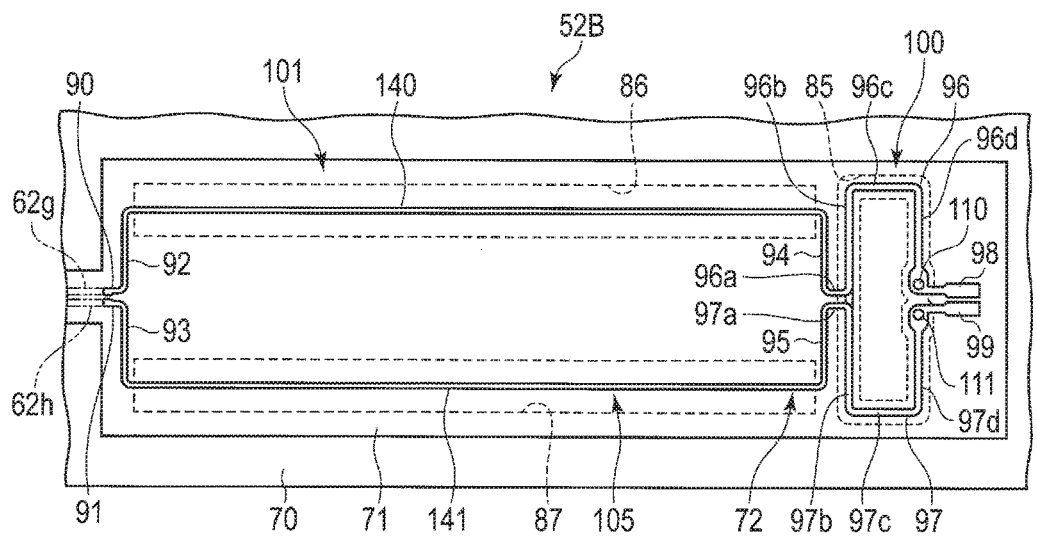
FIG. 15 is a plan view showing a test coupon of a pseudo flexure according to a second embodiment.
Figure 16:
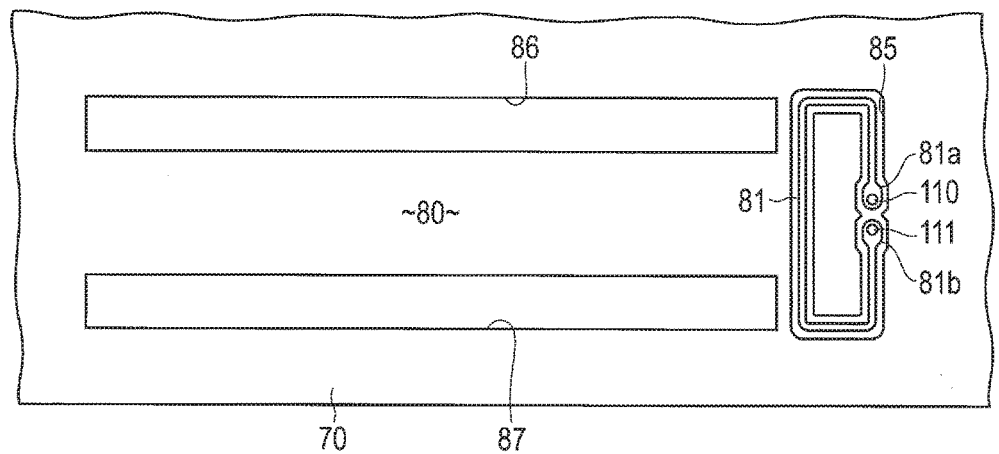
FIG. 16 is a plan view of a substrate of the test coupon shown in FIG. 15.

FIG. 15 shows a test coupon 52B according to a second embodiment. FIG. 16 is a plan view of a substrate 70 of the test coupon 52B shown in FIG. 15. A pseudo element circuit 105 of the test coupon 52B also includes a main circuit section 100 of a double-layered conductor structure, and an adjusting section 101 of a single-layered conductor structure. The adjusting section 101 comprises a pair of linear conductors 140 and 141 which are shaped like straight lines arranged parallel to each other. The linear conductors 140 and 141 are formed of the second metal (for example, copper) likewise a metal layer 72. The linear conductors 140 and 141 are part of a metal layer 72, and are arranged on a second surface 71b of a dielectric layer 71.

The linear conductor 140 is formed between an input-side electrical path 92 and an intermediate electrical path 94 which are provided on one side. The linear conductor 141 is formed between an input-side electrical path 93 and an intermediate electrical path 95 which are provided on the other side. The intermediate electrical paths 94 and 95 electrically conduct to second pattern conductors 96 and 97 of the main circuit section 100, respectively. The main circuit section 100 of the test coupon 52B has the structure having a commonality with that of the main circuit section 100 of the first embodiment.

In the substrate 70 of the test coupon 52B, openings 86 and 87 are formed at positions corresponding to the linear conductors 140 and 141. The openings 86 and 87 extend parallel to each other along the linear conductors 140 and 141. As described above, the test coupon 52B of the present embodiment comprises the main circuit section 100 and the adjusting section 101. The main circuit section 100 has a double-layered conductor structure including a first pattern conductor 81 and the second pattern conductors 96 and 97. In contrast, the adjusting section 101 has a single-layered conductor structure including the linear conductors 140 and 141. Since the structures of the test coupon 52B of the second embodiment other than the above have commonality with the structures of the test coupon 52A of the first embodiment, common reference numbers are assigned to parts that are common to the two embodiments and explanations of them are omitted.

FIG. 17 is a plan view showing a test coupon 52C according to a third embodiment. FIG. 18 is a plan view of a substrate 70 of the test coupon 52C shown in FIG. 17. A main circuit section 100 of the test coupon 52C comprises second pattern conductors 96 and 97 each having a meandering shape, in other words, which wind in zigzags. The second pattern conductor 96 is connected to an end 82a of a linear conductor 82 via an intermediate electrical path 94 and a connection conductor 112 which are provided on one side. The second pattern conductor 97 is connected to an end 83a of a linear conductor 83 via an intermediate electrical path 95 and a connection conductor 113 which are provided on the other side.

On the substrate 70 of the test coupon 52C, a first pattern conductor 81 having a meandering shape corresponding to the second pattern conductors 96 and 97 is formed. The first pattern conductor 81 overlaps the second pattern conductors 96 and 97 with a dielectric layer 71 interposed therebetween. Both ends 81a and 81b of the first pattern conductor 81 are connected to pads 98 and 99 for probing via connection conductors 110 and 111 and detection-side electrical paths 145 and 146. Also, the both ends 81a and 81b of the first pattern conductor 81 are connected to the second pattern conductors 96 and 97 via the connection conductors 110 and 111. Since the structures of the test coupon 52C of the third embodiment other than the above have commonality with the structures of the test coupon 52A of the first embodiment, common reference numbers are assigned to parts that are common to the two embodiments and explanations of them are omitted. Note that an adjusting section 101 of the test coupon 52C may be structured by linear conductors 140 and 141 formed of copper, likewise the adjusting section 101 (FIG. 15) of the second embodiment.

FIG. 19 shows a test coupon 52D according to a fourth embodiment. FIG. 20 shows a substrate 70 of the test coupon 52D. Filter circuits 150 and 151 are formed between second pattern conductors 96 and 97 of a main circuit section 100 and pads 98 and 99 for probing. The filter circuits 150 and 151 electrically conduct to the second pattern conductors 96 and 97 and the pads 98 and 99 for probing via conductors 155 and 156. In the substrate 70, an opening 157 is formed along the conductors 155 and 156 of the filter circuits 150 and 151. Part of a metal layer 72 formed of copper which constitutes the filter circuits 150 and 151 and part of the substrate 70 are opposed to each other with a dielectric layer 71 interposed therebetween. As a capacitor component of the filter circuits 150 and 151 serves as a low-pass filter, a high-frequency component of a voltage waveform is suppressed.

FIG. 21 shows a voltage waveform of the test coupon 52D shown in FIG. 19. Because the filter circuits 150 and 151 are provided, undulations of a Vpeak portion can be reduced. Since the structures of the test coupon 52D of the fourth embodiment other than the above have commonality with the structures of the test coupon 52B (FIGS. 15 and 16) of the second embodiment, common reference numbers are assigned to parts that are common to the two embodiments and explanations of them are omitted.

Figure 22:
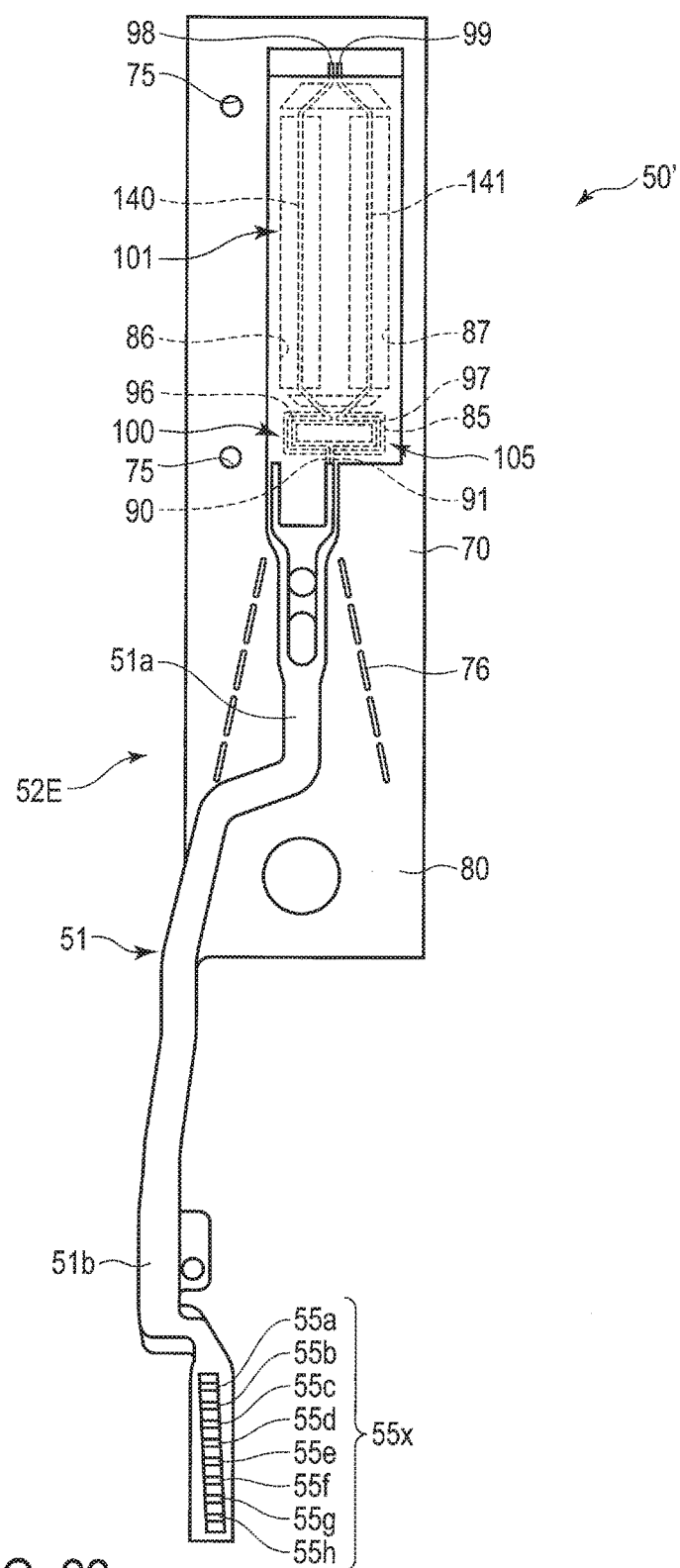
FIG. 22 is a plan view showing an example of a pseudo flexure according to a fifth embodiment.
Figure 23:
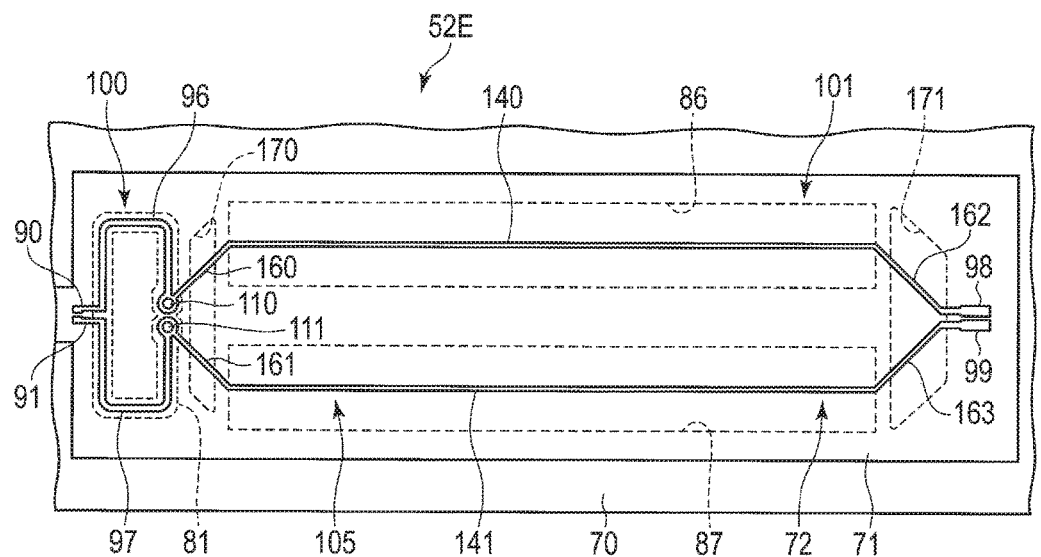
FIG. 23 is a plan view of a test coupon of the pseudo flexure shown in FIG. 22.
Figure 24:
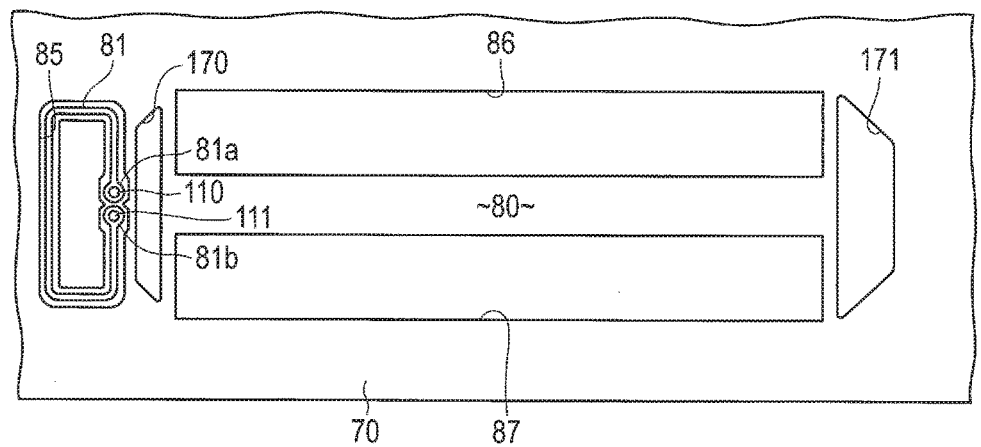
FIG. 24 is a plan view of a substrate of the test coupon shown in FIG. 23.

FIG. 22 is a plan view showing an example of a pseudo flexure 50' comprising a test coupon 52E according to a fifth embodiment. FIG. 23 is a plan view of the test coupon 52E, and FIG. 24 is a plan view of a substrate 70 of the test coupon 52E. In the test coupon 52E of the present embodiment, between input-side terminal portions 90 and 91 and pads 98 and 99 for probing, a main circuit section 100 is arranged close to the input-side terminal portions 90 and 91, and an adjusting section 101 is arranged close to the pads 98 and 99 for probing.

The main circuit section 100 of the test coupon 52E has a double-layered conductor structure including a first pattern conductor 81 formed of stainless steel and second pattern conductors 96 and 97 formed of copper likewise the other embodiments. Both ends 81a and 81b of the first pattern conductor 81 are connected to the second pattern conductors 96 and 97 via connection conductors 110 and 111. The second pattern conductors 96 and 97 electrically conduct to the input-side terminal portions 90 and 91. The both ends 81a and 81b of the first pattern conductor 81 are connected to linear conductors 140 and 141 formed of copper via the connection conductors 110 and 111 and intermediate electrical paths 160 and 161, respectively. The linear conductors 140 and 141 are constituent elements of the adjusting section 101 having a single-layered conductor structure.

The linear conductors 140 and 141 of the test coupon 52E electrically conduct to the pads 98 and 99 for probing via detection-side electrical paths 162 and 163, respectively. In the substrate 70, openings 86 and 87 are formed at positions corresponding to the linear conductors 140 and 141. An opening 170 is formed at a position corresponding to the intermediate electrical paths 160 and 161. An opening 171 is formed at a position corresponding to the detection-side electrical paths 162 and 163. Since a flexure body portion 51 of the pseudo flexure 50' has a commonality with the flexure body portion 51 (FIG. 4) of the first embodiment, common reference numbers are assigned to parts that are common to the two embodiments and explanations of them are omitted.

Figure 25:
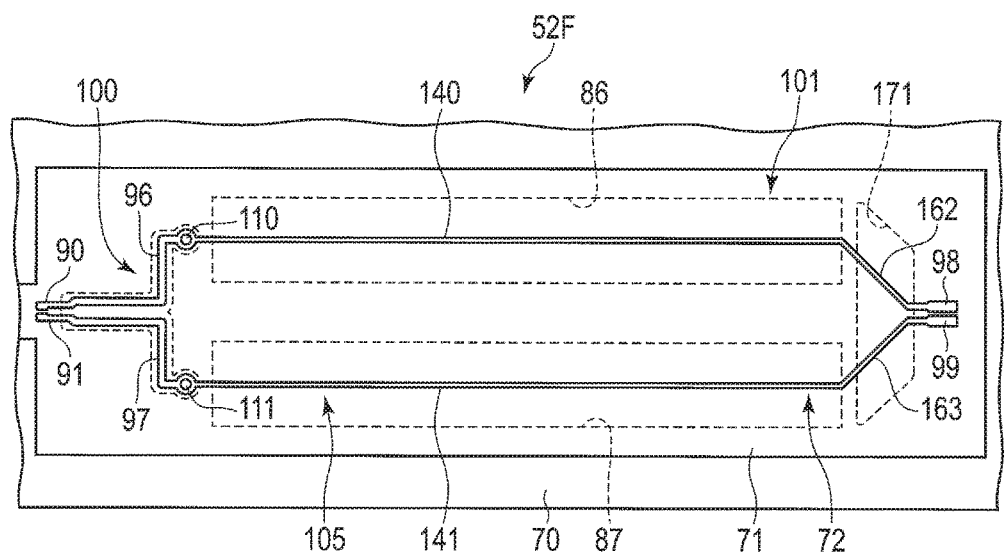
FIG. 25 is a plan view showing a test coupon of a pseudo flexure according to a sixth embodiment.
Figure 26:
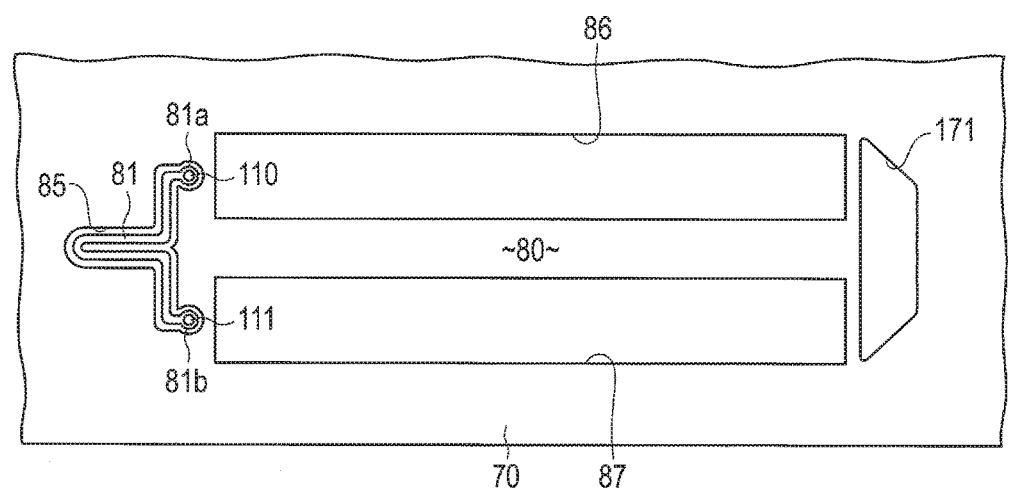
FIG. 26 is a plan view of a substrate of the test coupon shown in FIG. 25.

FIG. 25 shows a test coupon 52F according to a sixth embodiment. FIG. 26 is a plan view of a substrate 70 of the test coupon 52F. Also in a pseudo element circuit 105 of the present embodiment, a main circuit section 100 is arranged close to input-side terminal portions 90 and 91. An adjusting section 101 is arranged close to pads 98 and 99 for probing. The main circuit section 100 includes a substantially Y-shaped first pattern conductor 81 formed of stainless steel, as shown in FIG. 26, and a pair of L-shaped second pattern conductors 96 and 97 formed of copper, as shown in FIG. 25, which constitute a double-layered conductor structure. Both ends 81a and 81b of the first pattern conductor 81 are connected to the second pattern conductors 96 and 97 and linear conductors 140 and 141 via connection conductors 110 and 111. The second pattern conductors 96 and 97 electrically conduct to the input-side terminal portions 90 and 91. Since the structures of the test coupon 52F of the sixth embodiment other than the above have commonality with the structures of the test coupon 52E (FIGS. 23 and 24) of the fifth embodiment, common reference numbers are assigned to parts that are common to the two embodiments and explanations of them are omitted.

Needless to say, in carrying out the present invention, as well as the specific form of the flexure body portion and the test coupon which constitute the pseudo flexure, the specific form such as the shapes and arrangement of the substrate, first pattern conductor, second pattern conductor, linear conductor, and dielectric layer may be modified variously as needed. The second pattern conductors may be connected to the first pattern conductor at places other than the both ends of the first pattern conductor. Also, the dielectric layer may be formed of a dielectric material other than polyimide. Further, the pseudo flexure of the present invention can be used in a test of an electronic circuit other than a write electronic circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pseudo flexure for a disk drive comprising a flexure body portion including a conductive circuit portion, and a test coupon which electrically conducts to the conductive circuit portion,
   the test coupon comprising:
   a substrate formed of a first metal;
   a dielectric layer formed of an electrically insulating resin, and having a first surface and a second surface, the first surface overlapping the substrate;
   a metal layer formed of a second metal whose electrical resistance is different from that of the first metal, and arranged on the second surface of the dielectric layer;
   a pair of input-side terminal portions electrically connected to write conductors of the conductive circuit portion;
   a pair of pads for probing provided at a detection position; and
   a pseudo element circuit formed between the input-side terminal portions and the pads for probing,
   the pseudo element circuit comprising:
   a main circuit section having a double-layered conductor structure including a first pattern conductor formed of the first metal, and a pair of second pattern conductors, which is formed of the second metal, overlaps the first pattern conductor with the dielectric layer interposed therebetween, and is connected to the first pattern conductor; and
   an adjusting section having a single-layered conductor structure which includes a pair of linear conductors arranged along the dielectric layer, the linear conductors electrically connected to the second pattern conductors, respectively.

2. The pseudo flexure of claim 1, wherein a electrical resistance of the first metal is greater than a electrical resistance of the second metal.

3. The pseudo flexure of claim 2, wherein the first metal is stainless steel, and the second metal is copper.

4. The pseudo flexure of claim 1, wherein the linear conductors are formed of the first metal, and the linear conductors are arranged on the first surface of the dielectric layer.

5. The pseudo flexure of claim 4, wherein the substrate comprises a first opening formed around the first pattern conductor, and second openings formed around the linear conductors.

6. The pseudo flexure of claim 4, wherein the pseudo flexure comprises connection conductors which penetrate the dielectric layer in a thickness direction, and the second pattern conductors and the linear conductors are electrically connected to each other via the connection conductors.

7. The pseudo flexure of claim 4, wherein the substrate of the test coupon, the first pattern conductor, and the linear conductors are formed of stainless steel having chemical components common to each other.

8. The pseudo flexure of claim 1, wherein the flexure body portion comprises a metal base formed of the first metal, an insulating layer which is formed of electrically insulating resin and formed on the metal base, the conductive circuit portion formed on the insulating layer, and a cover layer which is formed of the electrically insulating resin and covers the conductive circuit portion.

9. The pseudo flexure of claim 1, wherein the substrate of the test coupon comprises a hole for positioning.

10. The pseudo flexure of claim 1, wherein the linear conductors are formed of copper likewise the second pattern conductors, and the linear conductors are arranged on the second surface of the dielectric layer.

11. The pseudo flexure of claim 10, wherein the substrate comprises openings formed along the linear conductors.

12. The pseudo flexure of claim 1, wherein between the input-side terminal portions and the pads for probing, the main circuit section is arranged close to the pads for probing, and the adjusting section is arranged close to the input-side terminal portions.

13. The pseudo flexure of claim 12, wherein a filter circuit is provided between the main circuit section and each of the pads for probing.

14. The pseudo flexure of claim 1, wherein between the input-side terminal portions and the pads for probing, the main circuit section is arranged close to the input-side terminal portions, and the adjusting section is arranged close to the pads for probing.

15. A method of testing an electronic circuit using a pseudo flexure for a disk drive,
   the pseudo flexure comprising a pseudo element circuit formed between an input-side terminal portion and a pad for probing,
   the pseudo element circuit including a main circuit section and an adjusting section,
   the main circuit section including a first pattern conductor formed of a first metal, and a pair of second pattern conductors formed of a second metal whose electrical resistance is different from that of the first metal, the pair of second pattern conductors overlapping the first pattern conductor with a dielectric layer interposed therebetween,
   the adjusting section including a pair of linear conductors arranged along the dielectric layer, and being electrically connected to the pair of second pattern conductor,
   the method comprising:
   inputting a pulse signal to the pseudo element circuit from the input-side terminal portion;
   adjusting an inductance component and a resistance component of the main circuit section so that an output waveform detected by the pad for probing approximates a target waveform, and also adjusting an inductance component and a resistance component of the adjusting section; and inputting a test pulse signal to the electronic circuit, and testing electrical properties of the electronic circuit based on the waveform output from the pad for probing.

* * * * *